United States Patent
Pao et al.

(10) Patent No.: US 10,915,388 B2
(45) Date of Patent: Feb. 9, 2021

(54) DATA STORAGE DEVICE AND ASSOCIATED OPERATING METHOD CAPABLE OF DETECTING ERRORS AND EFFECTIVELY PROTECTING DATA

(71) Applicant: Silicon Motion, Inc., Zhubei (TW)

(72) Inventors: Yi-Hua Pao, Hsinchu (TW); Wen-Chi Hu, Zhubei (TW)

(73) Assignee: SILICON MOTION, INC., Zhubei (TW)

( * ) Notice: Subject to any disclaimer, the term of this patent is extended or adjusted under 35 U.S.C. 154(b) by 121 days.

(21) Appl. No.: 15/868,190

(22) Filed: Jan. 11, 2018

(65) Prior Publication Data
US 2019/0155671 A1 May 23, 2019

(30) Foreign Application Priority Data

Nov. 17, 2017 (TW) .............................. 106139990 A (51) Int. Cl.
*G06F 11/00* (2006.01)
*G06F 11/07* (2006.01)
*G06F 11/10* (2006.01)
*G11C 29/52* (2006.01)
*G11C 29/44* (2006.01)

(52) U.S. Cl.
CPC ........ *G06F 11/076* (2013.01); *G06F 11/0727* (2013.01); *G06F 11/0772* (2013.01); *G06F 11/1048* (2013.01); *G06F 11/1068* (2013.01); *G11C 29/52* (2013.01); *G11C 29/44* (2013.01)

(58) Field of Classification Search
CPC ............... G06F 11/076; G06F 11/0727; G06F 11/0772; G06F 11/1068; G11C 29/44; G11C 29/52
See application file for complete search history.

(56) References Cited

U.S. PATENT DOCUMENTS

| | | | |
|---|---|---|---|
| 6,697,976 B1 * | 2/2004 | Satoh | G11B 20/18 360/65 |
| 7,844,880 B2 | 11/2010 | Vainsencher et al. | |
| 10,332,613 B1 * | 6/2019 | Micheloni | G11C 29/38 |
| 2008/0148129 A1 | 6/2008 | Moon et al. | |
| 2011/0145633 A1 * | 6/2011 | Dickens | G06F 11/073 714/6.1 |

(Continued)

FOREIGN PATENT DOCUMENTS

| | | |
|---|---|---|
| CN | 107135006 A | 9/2017 |
| JP | 2-135533 A | 5/1990 |

(Continued)

OTHER PUBLICATIONS

Japanese Office Action for Japanese Application No. 2018-049674, dated Jan. 28, 2020.

*Primary Examiner* — Elmira Mehrmanesh
(74) *Attorney, Agent, or Firm* — Birch, Stewart, Kolasch & Birch, LLP (57) ABSTRACT

The data storage device includes a first memory having error correction capability, and a controller coupled to the first memory. The controller is configured to calculate an error count of the first memory. The controller is configured to report a message to a host when the controller determines that an alarm condition is satisfied. The alarm condition is related to the error count of the first memory and a threshold count.

9 Claims, 5 Drawing Sheets

(56) References Cited

U.S. PATENT DOCUMENTS

| | | | |
|---|---|---|---|
| 2011/0214039 A1 | 9/2011 | Steiner et al. | |
| 2012/0166864 A1* | 6/2012 | Zhang | G06F 11/0751 714/2 |
| 2013/0312123 A1* | 11/2013 | Chyan | G06F 21/78 726/34 |
| 2014/0331109 A1* | 11/2014 | Wakuda | G06F 11/076 714/799 |
| 2015/0043280 A1* | 2/2015 | Pao | G11C 16/225 365/185.18 |
| 2015/0046637 A1* | 2/2015 | Chien | G11C 7/04 711/103 |
| 2015/0046762 A1* | 2/2015 | Chien | G11C 7/04 714/721 |
| 2016/0055056 A1 | 2/2016 | Son et al. | |
| 2016/0117219 A1* | 4/2016 | Halbert | G06F 11/1004 714/799 |
| 2017/0102988 A1* | 4/2017 | Purushothaman | G06F 11/0748 |
| 2017/0139795 A1* | 5/2017 | Komano | G06F 21/00 |
| 2017/0250714 A1 | 8/2017 | Kim | |
| 2017/0259687 A1* | 9/2017 | Chikkannanavar | H02J 7/0047 |
| 2017/0346596 A1* | 11/2017 | Desimone | G06F 11/3051 |

FOREIGN PATENT DOCUMENTS

| | | |
|---|---|---|
| JP | H10-307686 A | 11/1998 |
| JP | 2004-259324 A | 9/2004 |
| JP | 2006-59002 A | 3/2006 |
| JP | 2009-217603 A | 9/2009 |
| JP | 2014-10607 A | 1/2014 |
| JP | 2015-032317 A | 2/2015 |
| JP | 2016-157470 A | 9/2016 |
| TW | 200519595 A | 6/2005 |
| TW | I244587 B | 12/2005 |

\* cited by examiner

DATA STORAGE DEVICE AND ASSOCIATED OPERATING METHOD CAPABLE OF DETECTING ERRORS AND EFFECTIVELY PROTECTING DATA

This application claims the benefit of Taiwan application Ser. No. 106139990, filed Nov. 17, 2017, the disclosure of which is incorporated by reference herein in its entirety.

TECHNICAL FIELD

The disclosure relates in general to a data storage device and associated operating method, and more particularly to a data storage device capable of correcting errors and informing a host potential problems as early as possible.

BACKGROUND

As semiconductor process technology evolves, the capacity and density of memory have rapidly grown, and the probability of errors in the data stored in memory has increased as well. In response thereto, data storage devices generally use error detection and error correction techniques to effectively protect the data stored in the memory, to avoid data being affected by errors, and to improve reliability of the data storage device. The present invention provides an operating method suitable for a data storage device having error correction capability so as to discover the potential problems in the memory as early as possible.

SUMMARY

The disclosure relates to a data storage device and associated operating method, such that potential problems in the memory can be discovered as early as possible to inform the host.

According to one embodiment, a data storage device is provided.

The data storage device includes a first memory having error correction capability, and a controller coupled to the first memory. The controller is configured to calculate an error count of the first memory. The controller is configured to report a message to a host when the controller determines that an alarm condition is satisfied. The alarm condition is related to the error count of the first memory and a threshold count.

According to another embodiment, an operating method used in a data storage device is provided. The data storage device includes a controller and a first memory. The operating method includes the following steps. Calculate an error count of the first memory by the controller. Report a message to a host by the controller when the controller determines that an alarm condition is satisfied, wherein the alarm condition is related to the error count of the first memory and a threshold count.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Memories may be categorized into volatile memories and non-volatile memories. Volatile memories include for example random access memory (RAM). Non-volatile memories include for example read only memory (ROM) and Flash Memory. As the amount of data stored in memory increases, most memories have error correction capabilities to improve reliability. For example, error correcting code (ECC) may be used to correct errors in data storage. The error correction code used by the memory may include, for example, BCH code, and low density parity check (LDPC). The error correcting code may be implemented as hardware circuit in the memory to achieve fast error correction. The error correction circuit in the following disclosure will be referred to as ECC circuit.

In general, an ECC circuit has limited error correction capability. For example, for data with a bit width of N bits, m bits of errors can be corrected (N and m are positive integers, and m<N). When there is an error in the data stored in the memory, the ECC circuit in the memory can correct the data successfully if the number of error bits is within the range of the error correction capability. Because the data is successfully corrected, the data storage device can still perform normal read and write operations. However, when the ECC circuit performs error correction, it means that the data storage capability of the memory is impaired and there may be some problems inside the memory. Taking a flash memory as an example, after multiple program and erase operations on the flash memory, a data retention problem may occur so that the number of error bits increases. In addition, the memory program disturb and read disturb may also increase the number of error bits. Further, charged particles from cosmic rays or trace radioactive elements in the material may also cause soft errors in the memory. When the number of error bits increases, although the normal operation of the current circuit can be maintained by the ECC circuit, it also indicates that there may be a potential problem in the memory. If these problems are ignored, the number of error bits in the memory may become too many to be recovered by the error correction capability of the ECC circuit, and thus the error cannot be successfully corrected. The data storage device and operating method disclosed in the present invention may utilize these errors as valuable alarm information to inform the host as early as possible, so as to facilitate the host or the user to perform subsequent corresponding processing steps on the data storage device.

Figure 1:
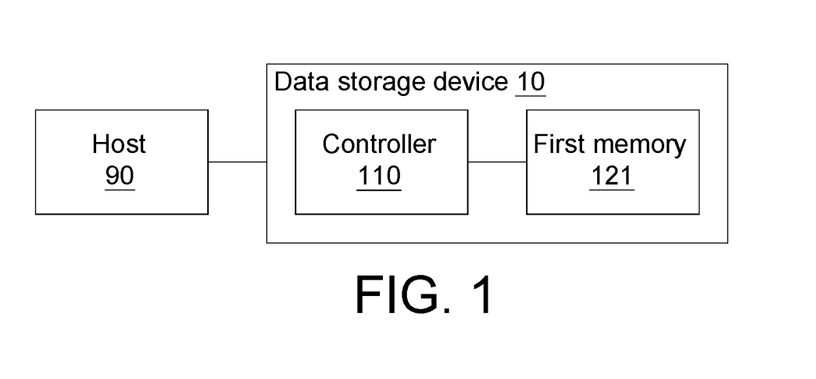
FIG. 1 shows a diagram of a data storage device according to one embodiment of the disclosure.

FIG. 1 shows a diagram of a data storage device according to one embodiment of the disclosure. The data storage device 10 includes a first memory 121 and a controller 110. The first memory 121 has error correction capability. The first memory 121 may be a flash memory, a phase change memory, a magnetoresistive RAM, a ferroelectric RAM, a dynamic RAM (DRAM), a static RAM (SRAM). For example, the first memory 121 has an ECC circuit inside.

The controller 110 is coupled to the first memory 121. The controller 110 may be configured to calculate and correct the error bits in the data stored in the first memory 121. For example, when the controller 110 detects an error bit, the controller 110 may make the ECC circuit to perform data correction, or the controller 110 may change the operating voltage of the first memory 121 to re-read rata stored in the first memory 121. The controller 110 increases an error count by 1 if the above condition happens. When the controller 110 determines that an alarm condition is satisfied, such as the value of the error count is greater than or equal to a count threshold (such as 10), the controller 110 reports a message to the host 90. The host 90 is for example a computer, a mobile phone, a processor, or other hardware devices that can access the data storage device 10 by address information. The host 90 may issue a read command or a write command to the data storage device 10. The controller 110 determines whether the alarm condition is satisfied by calculating the error count of the first memory 121, so as to discover potential problems in the first memory 121 as early as possible. The controller 110 may inform the host 90 such problem to let the host 90 know that although the first memory 121 still works normally at present, the first memory 121 might be potentially at risk. As such, certain follow-up processing steps may be performed on the data storage device 10 earlier. For example, the data storage device enters a read only mode, the operation of the data storage device is suspended, or the data stored in the data storage device is copied to another data storage device.

The communication interface between the controller 110 and the first memory 121 is for example open NAND flash interface (ONFI), DDR PHY interface (DFI), or another interface related to memory communication. The communication interface between the controller 110 and the host 90 is for example serial advanced technology attachment (SATA), parallel advanced technology attachment (PATA), universal serial bus (USB), secure digital (SD) card, universal flash storage (UFS), compact flash (CF) card, peripheral component interconnect express (PCI Express), serial attached SCSI (SAS). The communication protocol adopted by the controller 110 and the host 90 is for example non-volatile memory express (NVMe) or advanced host controller interface (AHCI).

Figure 2:
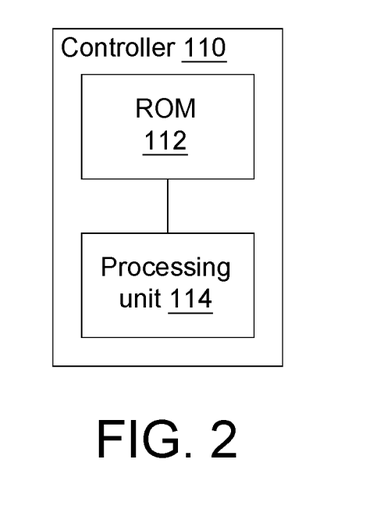
FIG. 2 shows a diagram of a controller according to one embodiment of the disclosure.

FIG. 2 shows a diagram of a controller according to one embodiment of the disclosure. The controller 110 includes a read-only memory (ROM) 112 and a processing unit 114. The ROM 112 stores program codes, parameters, and data required for booting the controller 110. After the controller 110 boots up, program code, parameters, and data required for the operation of the controller 110 may be fetched from the first memory 121. The controller 110 controls the first memory 121 based on the firmware. The processing unit 114 is for example a microprocessor, a microcontroller, an arithmetic circuit, or other circuits that can execute program codes.

Figure 3:
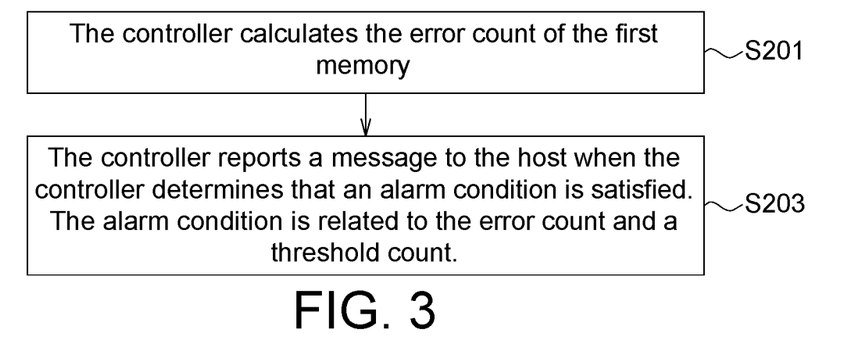
FIG. 3 shows a flowchart of an operating method used in a data storage device according to one embodiment of the disclosure.

FIG. 3 shows a flowchart of an operating method used in a data storage device according to one embodiment of the disclosure. The operating method includes the following steps. Step S201: the controller 110 calculates an error count of the first memory. Step S203: the controller 110 reports a message to the host when the controller 110 determines that an alarm condition is satisfied. The alarm condition is for example the value of the error count is greater than or equal to a count threshold.

In one embodiment, when the controller 110 determines that the alarm condition is satisfied, the controller 110 enters (starts) a read only mode. That is, the data storage device 10 enters the read only mode. In the read only mode, the data stored in the first memory 121 will not be modified. There will be no new data written to the first memory 121. The host 90 can only perform read operation on the data storage device 10. In one embodiment, the read only mode may be implemented as a dummy write mode. In the dummy write mode, when the host 90 issues a write request to the data storage device 10, the controller 110 does not perform the write operation. Instead, the controller 110 directly returns a message indicating write failure to the host 90. As such, the data stored in the first memory 121 will not be changed, preventing possible further damage to the data. In addition, the host 90 can be aware of the abnormal condition of the data storage device 10 based on the received write failure message. For example, when the data storage device 10 operates in the read only mode, the application on the host 90 can still be executed normally if this application only needs to read data from the data storage device 10. However, the host 90 will not be able to write log data corresponding to this application to the first memory 121 in the data storage device 10.

In another embodiment, when the controller 110 determines that the alarm condition is satisfied, the controller 110 locks a read function and a write function of the data storage device 10. The data storage device 10 cannot be read or written in the locked state. The controller 110 may return a message indicating read failure to the host 90 when the host 90 issues a read request to the data storage device 10; and the controller 110 may return a message indicating write failure to the host 90 when the host 90 issues a write request to the data storage device 10. Further damage to the data stored in the first memory 121 can thus be prevented by locking the data storage device 10.

In one embodiment, when the controller 110 determines that the alarm condition is satisfied, the controller 110 reports the message to the host 90 by changing voltage at a general purpose input output (GPIO) terminal, such as pulling up or pulling down the voltage level at one GPIO terminal.

In another embodiment, the message reported by the controller 110 to the host 90 includes a Self-Monitoring Analysis and Reporting Technology (SMART) error status. The SMART error status may include physical parameters corresponding to the data storage device 10, the controller 110, or the first memory 121. The SMART error status has a specific format and thus can be identified by the host 90. The host 90 may decide follow-up procedures by itself after receiving the message from the controller 110. For example, the host 90 may display the message corresponding to the error status to a user interface to let the user know the situation, and hence the user may manually deal with the problem, such as replacing the data storage device 10 or the first memory 121. Alternatively, the host 90 may lock the data storage device 10 and stop accessing the data storage device 10.

In one embodiment, the alarm condition used by the controller 10 is that a total error count $E_{f1}$ is greater than a first error count threshold $F_{th1}$, where the total error count $E_{f1}$ represents the number of times that an error bit is detected by the first memory 121 during a time period $T_P$. The values for the time period $T_P$ and the first error count threshold $F_{th1}$ may both be pre-determined. For example, the time period $T_P$ may be 30 minutes, and the first error count threshold $F_{th1}$ may be 2. It should be noted that the numerical values used herein are merely exemplary rather than limiting the invention. Different values may be used in other embodiments. When the total error count $E_{f1}$ representing the number of times that an error bit is detected by the first memory 121 during the time period $T_P$ is greater than the first error count threshold $F_{th1}$, it indicates that error bits appear too frequently in the first memory 121 and thus the host 90 is informed about this situation. On the other hand, if the total error count $E_{f1}$ representing the number of times that an error bit is detected by the first memory 121 during the time period $T_P$ is less than the first error count threshold $F_{th1}$, then the total error count $E_{f1}$ may be reset to zero after this time period $T_P$ ends. The total error count $E_{f1}$ may be re-calculated in the next time period $T_P$.

In another embodiment, the controller 110 only increases the total error count $E_{f1}$ when the number of error bits detected exceeds a warning value. For example, the total error count $E_{f1}$ is increased by 1 only when the number of error bits exceeds 60. In this way, the normal increase in the number of error bits caused by the normal aging of the first memory 121 does not result in the increase of the total error count $E_{f1}$ when the number of error bits is less than 60, so as to avoid unnecessary troubles.

In another embodiment, the calculation of a history total error count $E_{t1}$ may start from the first time power-on of the data storage device 10 after being manufactured. This value (the history total error count $E_{t1}$) is not reset to zero, and can be used to record the total number of times that an error bit is detected during the data reading operation of the first memory 121 after the data storage device 10 has been manufactured. In this embodiment, the alarm condition is satisfied if one of the total error count $E_{f1}$ and the history total error count $E_{t1}$ is greater than the first error count threshold $F_{th1}$.

The above description relates to the embodiment where the data storage device 10 includes one memory. As shown in FIG. 1, the first memory 121 may be a random access memory or a flash memory. For example, the data storage device 10 may be a removable storage device externally connected to a computer, and the first memory 121 is a flash memory. The operating method proposed in this disclosure may also be applied to a data storage device 10 including multiple memories, and the corresponding embodiments are given below.

Figure 4:
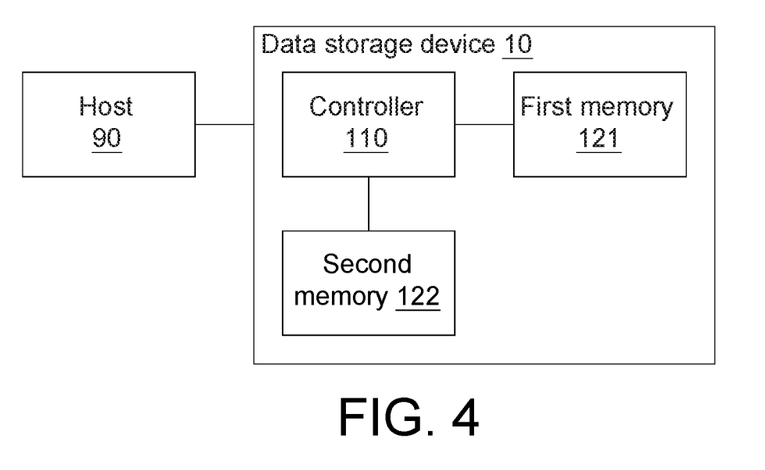
FIG. 4 shows a diagram of a data storage device including a first memory and a second memory according to one embodiment of the disclosure.

FIG. 4 shows a diagram of a data storage device 10 including a first memory 121 and a second memory 122 according to one embodiment of the disclosure. The second memory 122 has error correction capability. For example, the first memory 121 is a flash memory, the second memory is a dynamic random access memory (DRAM), and the data storage device 10 is a solid state drive (SSD). The controller 110 is coupled to the second memory 122. The controller 110 is configured to calculate an error count that the second memory 122 detects an error bit. In this embodiment, the alarm condition used by the controller 110 is related to the error count that the first memory 121 detects an error bit and the error count that the second memory 122 detects an error bit. The controller 110 informs the host 90 when at least one of the error count that the first memory 121 detects an error bit and the error count that the second memory 122 detects an error bit is too large, such that the host 90 can deal with the problem early.

In one embodiment, the alarm condition is that a first total error count $E_{f1}$ is greater than a first error count threshold $F_{th1}$ or a second total error count $E_{f2}$ is greater than a second error count threshold $F_{th2}$. The first total error count $E_{f1}$ represents the number of times that an error bit is detected by the first memory 121 during the time period $T_P$. The second total error count $E_{f2}$ represents the number of times that an error bit is detected by the second memory 122 during the time period $T_P$. The time period $T_P$ used by the first memory 121 and the second memory 122 is the same in this example for simple implementation. However, the invention is not limited thereto. In one embodiment the first memory 121 and the second memory 122 may use time periods of different lengths. The first error count threshold $F_{th1}$ and the second error count threshold $F_{th2}$ may be the same or different.

Figure 5:
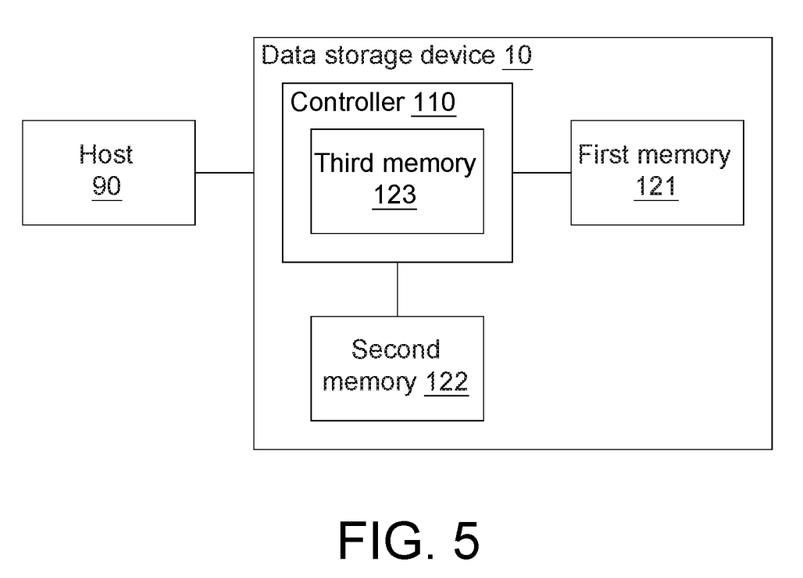
FIG. 5 shows a diagram of a data storage device including a first memory, a second memory, and a third memory according to one embodiment of the disclosure.

FIG. 5 shows a diagram of a data storage device 10 including a first memory 121, a second memory 122, and a third memory 123 according to one embodiment of the disclosure. The controller 110 has the third memory 123. For example, the third memory 123 is embedded in the controller 110. The third memory 123 may be a static random access memory (SRAM). The third memory 123 has error correction capability. The controller 110 is configured to calculate an error count that the third memory 123 detects an error bit. In this embodiment, the alarm condition is: the first total error count $E_{f1}$ is greater than the first error count threshold $F_{th1}$, the second total error count $E_{f2}$ is greater than the second error count threshold $F_{th2}$, or the third total error count $E_{f3}$ is greater than the third error count threshold $F_{th3}$. The first total error count $E_{f1}$ represents the number of times that an error bit is detected by the first memory 121 during the time period $T_P$, the second total error count $E_{f2}$ represents the number of times that an error bit is detected by the second memory 122 during the time period $T_P$, and the third total error count $E_{f3}$ represents the number of times that an error bit is detected by the third memory 123 during the time period $T_P$. As described above, the error count thresholds $F_{th1}$, $F_{th2}$, $F_{th3}$ used by each memory may be the same or different.

Figure 6:
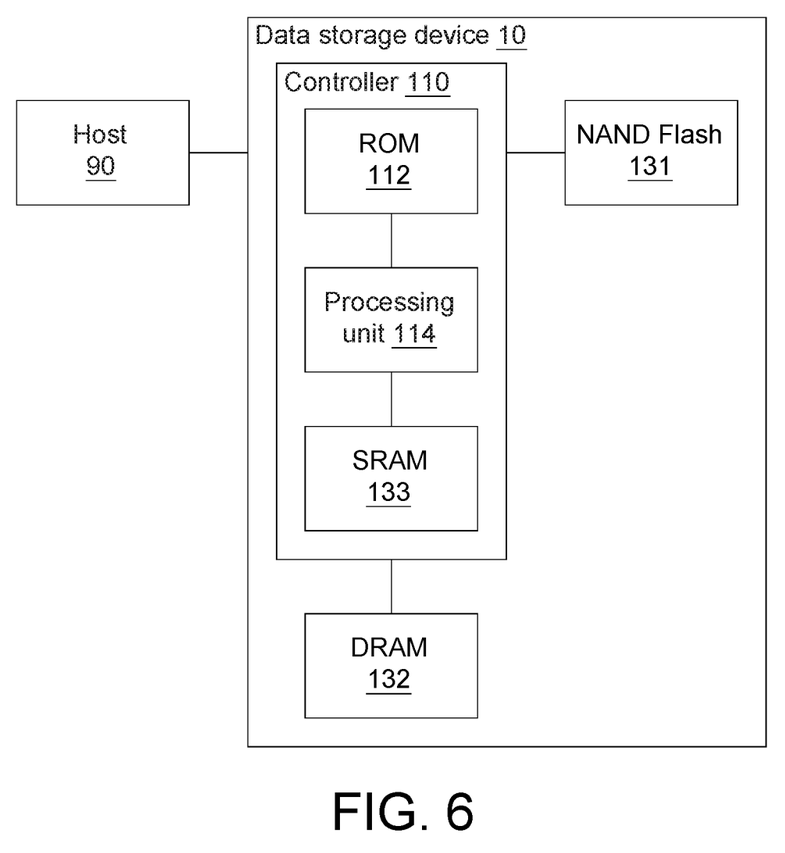
FIG. 6 shows a diagram of a data storage device according to one embodiment of the disclosure.

FIG. 6 shows a diagram of a data storage device according to one embodiment of the disclosure. The controller 110 includes a ROM 112, a processing unit 114, and a SRAM 133. The ROM 112 may store program codes executed by the processing unit 114. The SRAM 133 is for example the embedded memory of the controller 110. The controller 110 is coupled to the NAND flash 131 and the DRAM 132 through communication interfaces. In this embodiment, the controller 110 is configured to calculate an error count of end-to-end transmission. The error in end-to-end transmission is for example a data transmission error between the host 90 and the data storage device 10. An error detecting code may be used to determine whether there is an error in end-to-end transmission between the host 90 and the data storage device 10. The error detecting code is for example parity code, checksum, or cyclic redundancy check (CRC).

In the embodiment shown in FIG. 6, the alarm condition used by the controller 110 is: the number of times that an error bit is detected by the NAND flash memory 131 during the time period $T_P$ is greater than the first error count threshold $F_{th1}$, the number of times that an error bit is detected by the DRAM 132 during the time period $T_P$ is greater than the second error count threshold $F_{th2}$, the number of times that an error bit is detected by the SRAM 133 during the time period $T_P$ is greater than the third error count threshold $F_{th3}$, or the number of end-to-end transmission errors during the time period $T_P$ is greater than the fourth error count threshold $F_{th4}$.

Figure 7A:
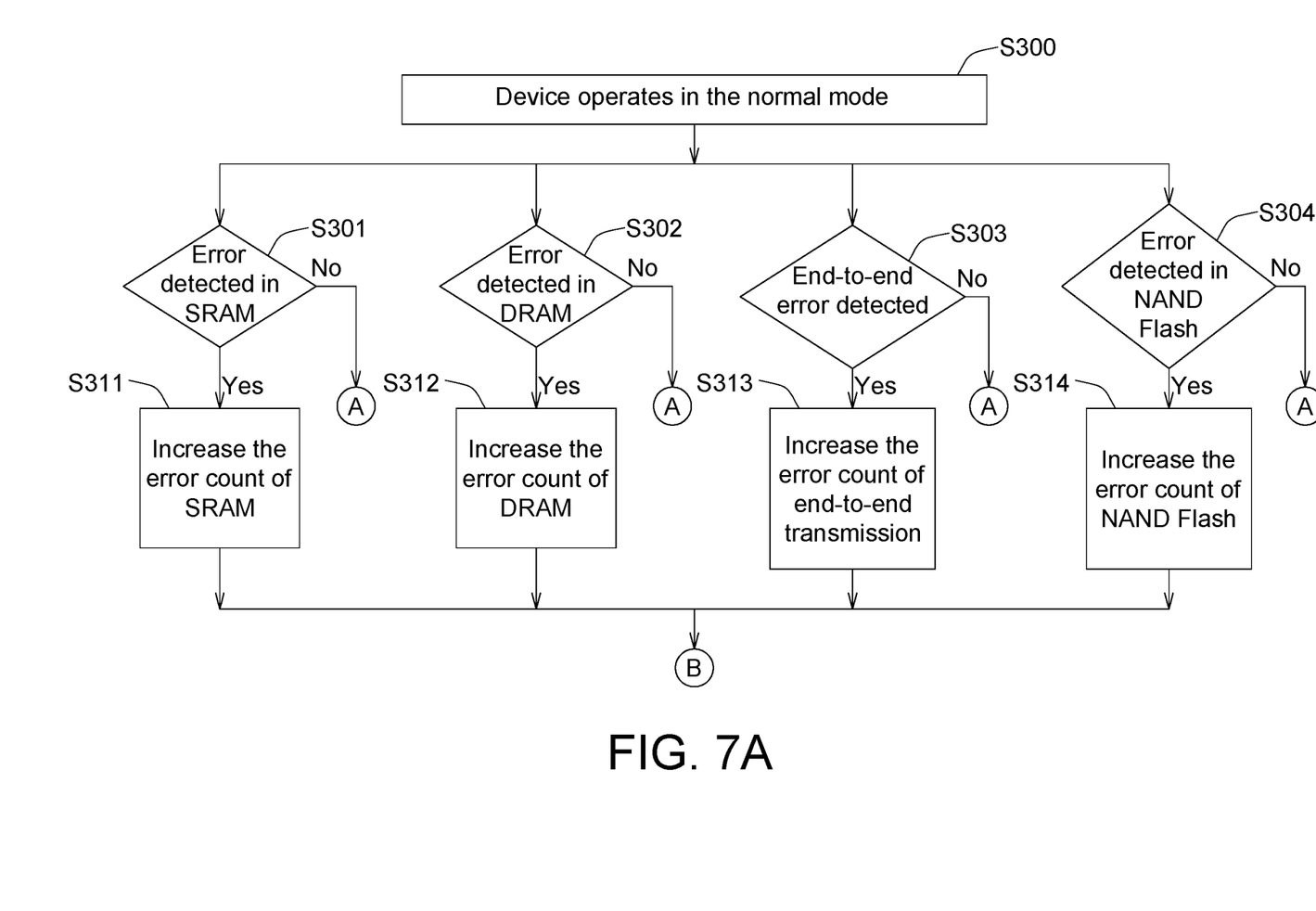
FIG. 7A and FIG. 7B show a flowchart of an operating method used in the data storage device shown in FIG. 6 according to one embodiment of the disclosure.
Figure 7B:
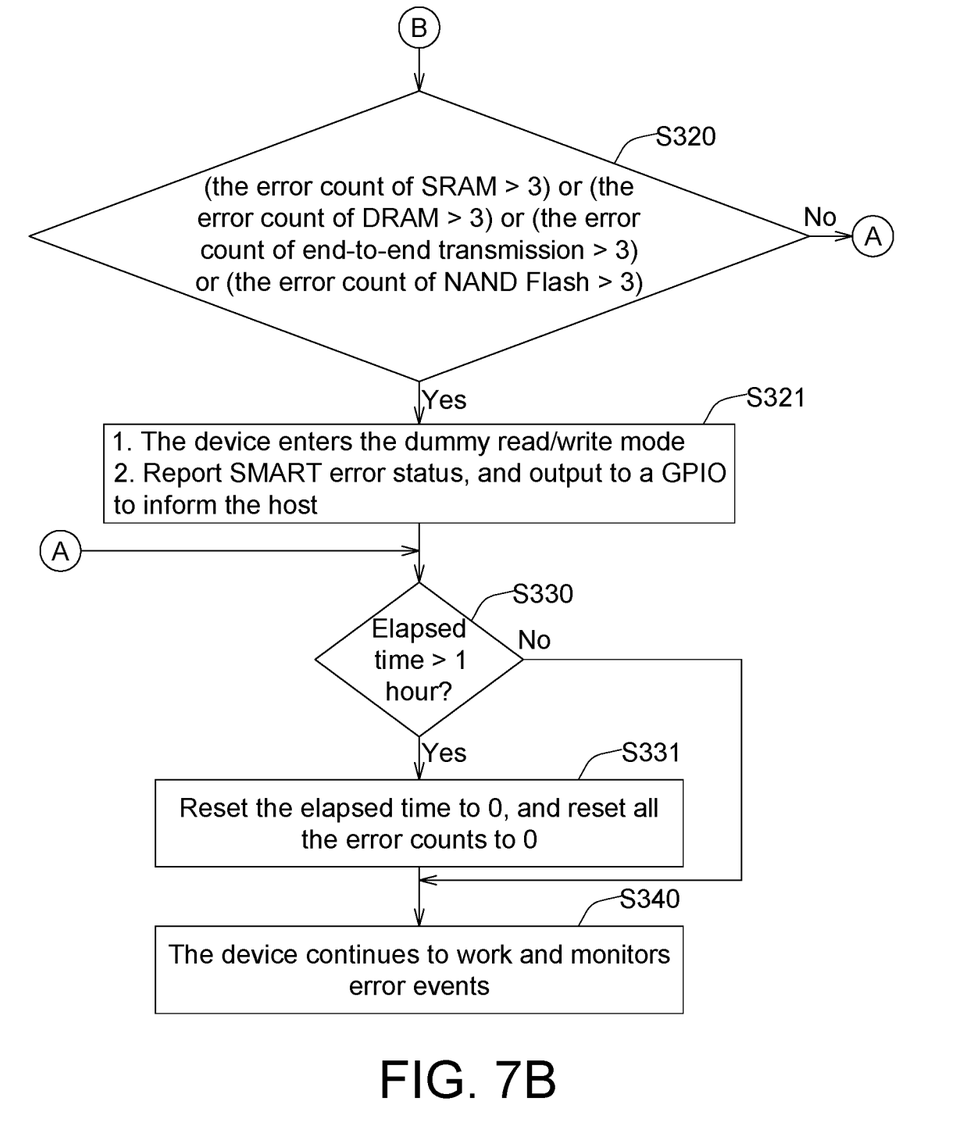

FIG. 7A and FIG. 7B show a flowchart of an operating method used in the data storage device shown in FIG. 6 according to one embodiment of the disclosure. Step S300: the data storage device 10 operates in the normal mode. Step S301: determine whether an error is detected in SRAM 133. That is, determine whether the user data stored in the SRAM 133 has an error bit. If yes, proceed to step S311: increase the error count of SRAM; if not, jump to step S330. Similarly, step S302: determine whether an error is detected in DRAM 132. That is, determine whether the user data stored in the DRAM 132 has an error bit. If yes, proceed to step S312: increase the error count of DRAM. Step S303: determine whether an end-to-end error is detected. That is, determine whether the end-to-end transmission data has an error bit. If yes, proceed to step S313: increase the error count of the end-to-end transmission. Step S304: determine whether an error is detected in NAND flash 131. That is, determine whether the user data stored in the NAND flash 131 has an error bit. If yes, proceed to step S314: increase the error count of NAND flash.

The controller 110 determines whether the alarm condition is satisfied in step S320. In this example, the time period $T_P$ is one hour, and the error count threshold $F_{th}$ for each error category is 3. The alarm condition is {(the error count of SRAM>3) or (the error count of DRAM>3) or (the error count of end-to-end transmission>3) or (the error count of NAND flash>3)}. In other words, as long as one of the four determination condition illustrated in step S320 is satisfied, there may be potential problems in the data storage device 10, and thus step S321 is executed. Otherwise proceed to step S330 if the determination result of step S320 is no.

Two sub-steps are illustrated in step S321. At least one of these sub-steps may be performed in implementation. The first sub-step: the data storage device 10 enters the dummy read/write mode, such as a dummy read mode, a dummy write mode, or a dummy read and dummy write mode. The second sub-step: report SMART error status to the host 90, and output to a GPIO to inform the host 90. Step 321 represents the processing steps when the alarm condition is satisfied. Step S330: determined whether the elapsed time has exceeded one hour (the time period $T_P$). If the elapsed time has exceeded one hour, proceed to step S331 to reset the elapsed time to 0 and reset all the error counts (including each error count in step S311, S312, S313, S314) to 0. Proceed to the calculation of error counts in the next time period $T_P$. If the determination result of step S330 is no, proceed to step S340: each error count recorded in the controller 110 remains the same, and the data storage device 10 continues to work and monitors error events.

According to the embodiments described above, by calculating the number of times an error occurs in a memory, potential problems in the memory can be detected early before the memory becomes unusable, and this information can be reported to the host. After the host or the user operating the host knows the warning information, the host or the user operating the host can lock the memory currently in use, or replace the memory currently in use with a new memory. The operation of replacing the memory is easy, low-cost, and the risk of data loss is also low. Consequently, preventive measures can be taken to prevent the data stored in the memory from sudden loss, in which case higher price has to be paid to save the stored data.

It will be apparent to those skilled in the art that various modifications and variations may be made to the disclosed embodiments. It is intended that the specification and examples be considered as exemplary only, with a true scope of the disclosure being indicated by the following claims and their equivalents.

What is claimed is:

1. A data storage device, comprising:
   a first memory having error correction capability; and
   a controller coupled to the first memory, wherein the controller is configured to calculate an error count of the first memory, and report a message to a host when the controller determines that an alarm condition is satisfied, wherein the alarm condition is related to the error count of the first memory and a threshold count,
   wherein the error count of the first memory is a first total error count which represents the number of times, when the number of error bits detected by the first memory exceeds a warning value, during a time period,
   wherein the controller is configured to lock a read function and a write function of the data storage device when the controller determines that the alarm condition is satisfied, and
   wherein the controller is configured to report the message to the host by changing voltage at a general purpose input output terminal.

2. The data storage device according to claim 1, wherein the data storage device enters a read-only mode when the controller determines that the alarm condition is satisfied.

3. The data storage device according to claim 1, wherein the message reported by the controller to the host includes a SMART error status.

4. The data storage device according to claim 1, wherein the first memory is a random access memory or a flash memory.

5. The data storage device according to claim 1, further comprising:
   a second memory having error correction capability;
   wherein the controller is coupled to the second memory, the controller is configured to calculate an error count that the second memory detects an error bit, the alarm condition is that a first total error count is greater than a first count threshold or a second total error count is greater than a second count threshold;
   wherein the first total error count represents the number of times that an error bit is detected by the first memory during a time period, and the second total error count represents the number of times that an error bit is detected by the second memory during the time period.

6. An operating method used in a data storage device, the data storage device comprising a controller and a first memory, the operating method comprising:
   calculating an error count of the first memory by the controller;
   reporting a message to a host by the controller when the controller determines that an alarm condition is satisfied, wherein the alarm condition is related to the error count of the first memory and a threshold count; and
   locking a read function and a write function of the data storage device by the controller when the controller determines that the alarm condition is satisfied,
   wherein the error count of the first memory is a first total error count which represents the number of times, when the number of error bits detected by the first memory exceeds a warning value, during a time period, and
   wherein the reporting of the message to the host comprises:
      changing voltage at a general purpose input output terminal.

7. The operating method according to claim 6, further comprising:
   the data storage device entering a read-only mode when the controller determines that the alarm condition is satisfied.

8. The operating method according to claim 6, wherein the message reported to the host includes a SMART error status.

9. The operating method according to claim 6, wherein the data storage device further comprises a second memory, and the operating method further comprises:
   calculating an error count that the second memory detects an error bit by the controller;
   wherein the alarm condition is that a first total error count is greater than a first count threshold or a second total error count is greater than a second count threshold;
   wherein the first total error count represents the number of times that an error bit is detected by the first memory during a time period, and the second total error count represents the number of times that an error bit is detected by the second memory during the time period.

* * * * *